United States Patent [19]
Iida et al.

[11] Patent Number: 5,592,015
[45] Date of Patent: *Jan. 7, 1997

[54] DIELECTRIC ISOLATED TYPE SEMICONDUCTOR DEVICE PROVIDED WITH BIPOLAR ELEMENT

[75] Inventors: Makio Iida, Ichinomiya; Tadashi Shibata, Toyokawa; Takayuki Sugisaka, Okazaki; Shoji Miura, Nukata-gun; Toshio Sakakibara, Nishio, all of Japan

[73] Assignee: Nippondenso Co., Ltd., Kariya, Japan

[*] Notice: The term of this patent shall not extend beyond the expiration date of Pat. No. 5,449,946.

[21] Appl. No.: 547,740

[22] Filed: Oct. 26, 1995

Related U.S. Application Data

[63] Continuation of Ser. No. 207,738, Mar. 9, 1994, abandoned.

[30] Foreign Application Priority Data

Mar. 10, 1993 [JP] Japan ................................. 5-049657

[51] Int. Cl.⁶ ............................. H01L 29/00; H01L 23/58
[52] U.S. Cl. ............................. 257/524; 257/526; 257/487
[58] Field of Search .................................... 257/524, 525, 257/526, 487, 488, 491, 630, 565, 566, 575, 372, 376, 162

[56] References Cited

U.S. PATENT DOCUMENTS

| | | | |
|---|---|---|---|
| 3,972,061 | 7/1976 | Nelson | 257/162 |
| 4,520,382 | 5/1985 | Shimura | 257/488 |
| 4,819,052 | 4/1989 | Hutter | 257/630 |
| 5,218,227 | 6/1993 | Kinoshita et al. | 257/565 |
| 5,241,211 | 8/1993 | Tashiro | 256/526 |
| 5,449,946 | 9/1995 | Sakikibara et al. | 257/493 |

FOREIGN PATENT DOCUMENTS

| | | |
|---|---|---|
| 0465961 | 1/1992 | European Pat. Off. |
| 3110852 | 5/1991 | Japan |
| 4317336 | 11/1992 | Japan |

OTHER PUBLICATIONS

Ueno et al, "A Fully Functional 1K ECL RAM On A Bonded SOI Wafer", Institute Of Electrical And Electronics Engineers, No. 1988, Dec. 1988, International Electron Devices Meeting, San Francisco, Dec. 11–14, 1988.

Patent Abstracts Of Japan, vol. 15, No. 308, (E–1097) Aug./1991 re JP–A–03 110852.

Primary Examiner—Wael Fahmy
Attorney, Agent, or Firm—Cushman, Darby & Cushman

[57] ABSTRACT

A semiconductor device is provided which makes a high withstand voltage bipolar transistor small and prevents deterioration in a switching speed of the transistor. A silicon oxide layer is formed on a silicon substrate, and a semiconductor island of one conductivity type which is isolated laterally by an isolation trench is formed on the silicon oxide layer. A silicon oxide film is formed on an outer periphery portion of the semiconductor island to bury the trench. In the semiconductor island, a bipolar transistor, namely a base region of the other conductivity type, is formed, and in the base region an emitter region of one conductivity type is formed and a collector region of one conductivity type is further formed. In the semiconductor island a diffusion region of the other conductivity type for extracting excessive carriers to which a constant electric potential is applied is further formed.

21 Claims, 15 Drawing Sheets

DISTANCE TO THE ISOLATION REGION

DIELECTRIC ISOLATED TYPE SEMICONDUCTOR DEVICE PROVIDED WITH BIPOLAR ELEMENT

This is a continuation of application Ser. No. 8/207,738, filed on Mar. 9, 1994.

BACKGROUND OF THE INVENTION

1. Field of the Invention

The present invention relates to a dielectric isolated type semiconductor device, and more particularly to a device integrating such a bipolar element as a bipolar transistor or the like.

2. Description of the Related Arts

In a bipolar integrated circuit integrating bipolar transistors, it is important to electrically isolate the elements from each other. As the isolation method, PN junctions are generally used. In case of, for instance, an NPN type bipolar transistor, an N type epitaxial layer formed on a P type substrate is partitioned by a P type diffusion layer to construct an island of a number of N type regions isolated from each other by PN junctions and to form a bipolar transistor in the N type island. For providing electrical isolation between the elements and between the elements and the substrate using this structure, the PN junctions formed between them are maintained in their reverse bias conditions. However, for preventing lowering of a withstand voltage, there is a problem that at a plane size of the bipolar transistor may not be made small. Namely, to make the element size small, it is necessary to shorten a distance from a diffusion region of an element to an isolation region, namely a P type isolation region. However, there is a probrem that the withstand voltage lowers when the distance to the isolation region is shortened, as shown in FIG. 28.

Therefore, a dielectric isolation method for isolating elements using insulating material such as a silicon oxide film or the like is known. This is a method in which an N type silicon layer is disposed on an insulation layer, the identical N type silicon layer is partitioned to form a plurality of N type silicon islands, an insulation film such as a silicon oxide film or the like is formed around the N type silicon island, and a circuit element is formed in the N type silicon island. With this method, as shown in FIG. 28, it is possible to maintain a high withstand voltage even if the distance to the isolation region is made small. In other words, it is possible to maintain the withstand voltage and also to make the element size small.

However, in the bipolar integrated circuit given by this dielectric isolation method it has been apparent that a switching time of the bipolar transistor has become slow.

SUMMARY OF THE INVENTION

An object of the present invention is to provide a bipolar integrated circuit of which element size may be made small with a withstand voltage ensured and which also prevents deterioration in a switching speed of a transistor.

For this purpose a semiconductor device according to the present invention is formed in a semiconductor island of a first conductivity type which is isolated by insulation material from a substrate and the other element regions. In the semiconductor island, a base region of a second conductivity type is formed, the remaining region of the first conductivity type of the semiconductor island except the base region is designed to be a collector region, an emitter region of a first conductivity type which is isolated by the base region from the collector region is formed in the base region, and further a diffusion region of a second conductivity type for extracting excessive carriers to which a constant electric potential is applied is formed.

Furthermore, an electrode for depletion layer restraint may be provided on the surface of the first conductivity type region of the island between the base region and the diffusion region for extracting excessive carriers, interposing an insulation film therebetween. An electric potential greater than an electric potential of the surface of the corresponding first conductivity type region may be applied to the electrode in order to restrain the depletion layer from extending.

Still further, a contact portion of the collector region may be sandwiched between the base region and the diffusion region for extracting excessive carriers.

According to the present invention, a switching speed quickens because excessive carriers are removed from the diffusion region for extracting excessive carriers when the bipolar transistor is switched from ON to OFF. Isolation from the substrate and the other element regions is given by the dielectric isolation method. Accordingly, it is possible to ensure the withstand voltage and also to make the element size small.

BRIEF DESCRIPTION OF THE DRAWINGS

These and other objects and advantages of this invention will become more apparent and more readily appreciated from the following detailed description of the presently preferred exemplary embodiments of the invention taken in conjunction with the accompanying drawings, of which:

FIG. 9 is a characteristics chart indicating a a switching speed when an NPN transistor with PN junction isolation is turned from OFF to ON;

FIG. 10 is a characteristics chart indicating a measuring result of a switching speed when a conventional dielectric isolated type NPN transistor is turned from OFF to ON;

FIG. 11 is a characteristics chart indicating a measuring result of a switching speed when the semiconductor device shown in FIG. 1 is turned from OFF to ON;

DETAILED DESCRIPTION OF THE EMBODIMENTS

First Embodiment

Hereinafter, a first embodiment in which the present invention is embodied is explained according to the drawings.

Figure 1:
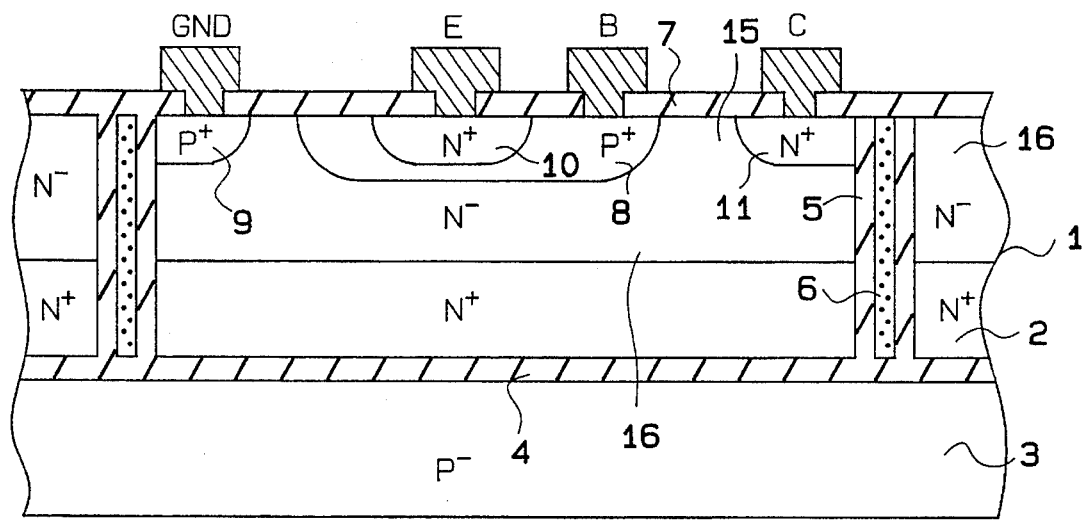
FIG. 1 is a sectional view of a semiconductor device of a first embodiment of the present invention.
Figure 2:
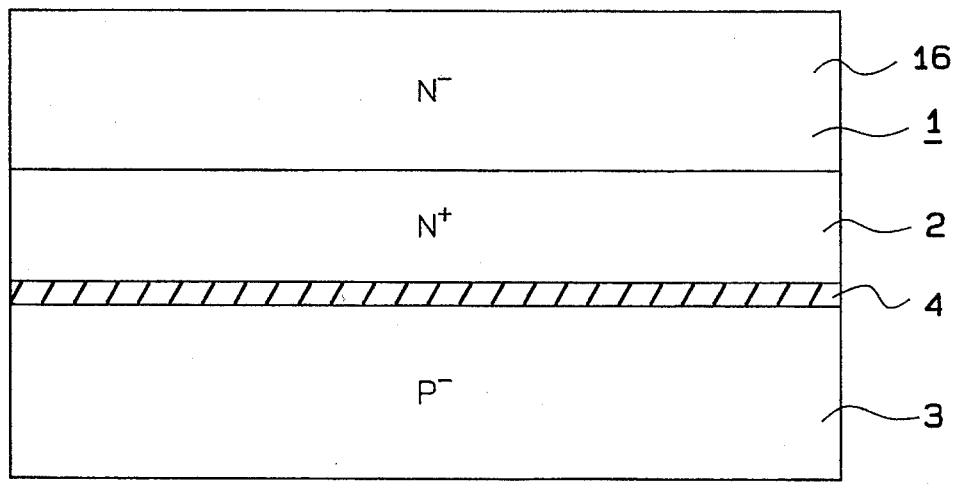
FIG. 2 through FIG. 4 are sectional views illustrating fabricating processes of the semiconductor device shown in FIG. 1.
Figure 3:
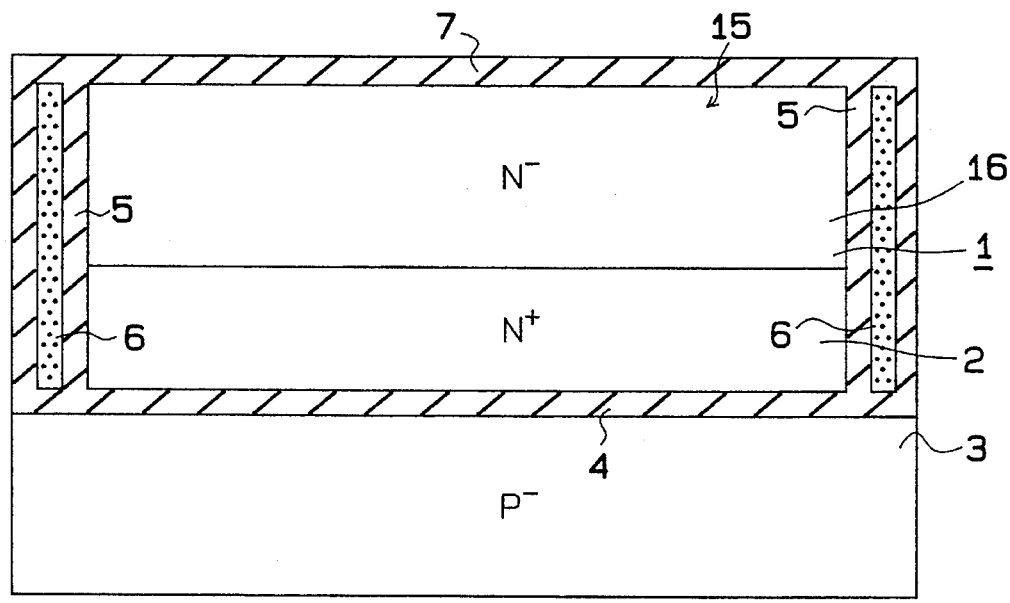
Figure 4:
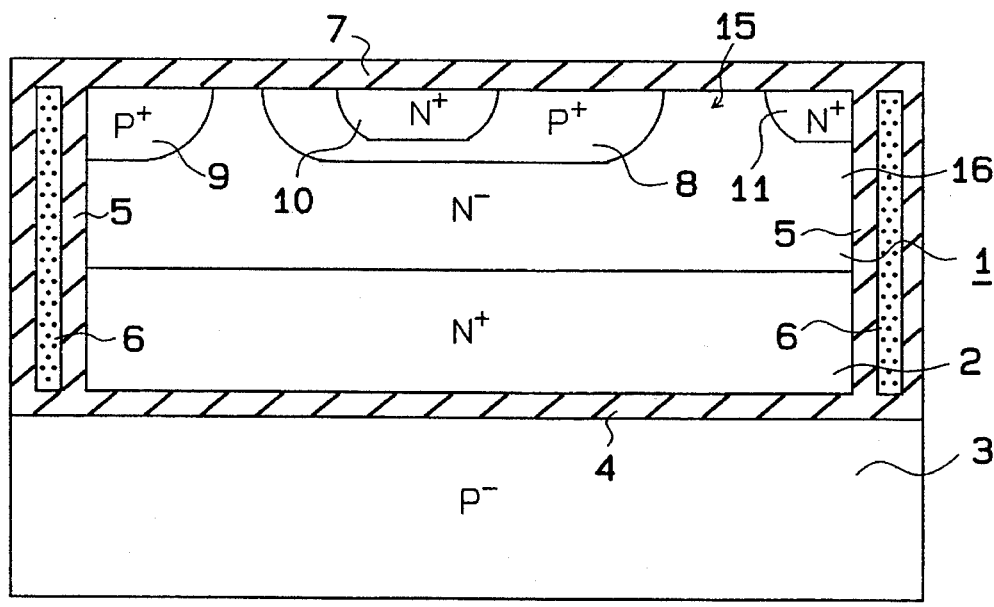

FIG. 1 is a sectional view of an NPN bipolar transistor to which a first embodiment of the present invention is applied. FIG. 2 through FIG. 4 are sectional views of a typical fabricating process.

The embodiment will be explained in order of manufacturing process steps. First of all, as shown in FIG. 2, a mirror polished $N^-$ silicon substrate 1 is provided and antimony is diffused with a vapor phase diffusion method to a depth of 3 μm at a surface of the substrate 1 to form an $N^+$ layer 2. Further, after one main face of a $P^-$ silicon substrate 3 has been mirror polished in addition, it is thermally oxidized to form a silicon oxide film 4 with a thickness of about 1 μm thereon. Then, with a conventional wafer direct bonding method both the substrates 1, 3 are laminated in a clean atmosphere, heated to about 1,100° C. and bonded to obtain a bonded substrate.

Furthermore, the $N^-$ silicon substrate 1 is polished at its surface to make the thickness from the silicon oxide film 4 about 17 μm. At this stage $N^+$ layer 2 of about 3 μm is present on the silicon oxide film 4 and an $N^-$ layer 16 of 14 μm is formed on the $N^+$ layer 2 to form a so-called an SOI substrate.

Next, as shown in FIG. 3 the silicon substrate 1 is trenched from its surface to the silicon oxide film 4 which is buried in the SOI substrate to form an island 15 composed of N type semiconductor substance. Namely, a field oxide film 7, silicon nitride film and a silicon oxide film as a mask are formed on the main face of the silicon substrate 1 in that order, the silicon oxide for the mask, the silicon nitride film and the field oxide film 7 are selectively etched to form an opening at a thin region of the field oxide film 7 which is thinned corresponding to an isolation region between elements, and the silicon substrate 1 is etched from the opening to form an isolation trench. After an insulation film (a silicon oxide film 5) has been formed on an inside wall of the isolation trench, polycrystalline silicon 6 is filled in the isolation trench. In this occasion, the island 15 is surrounded at its outer periphery by the silicon oxide film 5. Next, a surplus polycrystalline silicon film accumulated on an upper portion of the SOI substrate while filling the isolation trench with the polycrystalline silicon 6 is etched back. The silicon oxide film for masking is removed by etching, an oxide film is formed on an upper portion of the polycrystalline silicon 6 in the isolation trench, and a silicon nitride film is removed by etching. Accordingly, the island 15 is, as shown in FIG. 3, electrically isolated completely by the isolation trench and the insulation film (the silicon oxide film 5) in a lateral direction and electrically isolated completely from the silicon substrate 3 by the silicon oxide film 4.

Next, as shown in FIG. 4 each diffusion region is formed in the island 15. Namely, by a photo-lithography process, ion implantation process and diffusion process, a $P^+$ base region 8 and a $P^+$ excessive carrier extraction region 9 are formed, and an $N^+$ emitter region 10 and an $N^+$ collector region 11 are formed. Additionally in this structure an $N^-$ layer 16 corresponding to the island 15 becomes a low concentration collector, and the $N^+$ layer 2 becomes a buried collector of high concentration.

Contact holes are formed at the oxide film 7 and metal wiring of a collector electrode, an emitter electrode, a base electrode and an electrode for extracting excessive carriers are formed by a number of processes, i.e. metal film deposition, photo-lithography process and patterning process, to fabricate the bipolar integrated circuit of FIG. 1.

In the bipolar integrated circuit of the embodiment as shown in FIG. 1, the silicon oxide film 4 (a buried insulation film) is formed on the silicon substrate 3, the trench is formed from the substrate surface to the silicon oxide film 4, an the element portions are electrically isolated mutually by the silicon oxide films 4, 5. In this embodiment the polycrystalline silicon 6 for protection is filled in a cavity of the isolation trench. Further, metal electrodes of aluminum or the like are arranged on the island 15 and each electrode contacts with each diffusion region through each contact hole formed at the oxide film 7 which is a protective insulation layer of the substrate surface. E, B, and C in the figure are abbreviating reference characters of an emitter, a base and a collector, respectively. In addition, an electrode for extracting excessive carriers has a grounding electric potential (GND) applied thereto.

Additionally, the NPN junction type transistor given by this structure is completely isolated from the silicon substrate 3. Thus, the silicon substrate 3 may be a substrate of any type such as P type or N type.

Next, characteristic points of the bipolar integrated circuit constructed as described above will be described.

In the device of the first embodiment, it is not necessary to take the distance to the isolation portion for ensuring the withstand voltage, as compared with a conventional device isolated by a PN junction.

Figure 5:
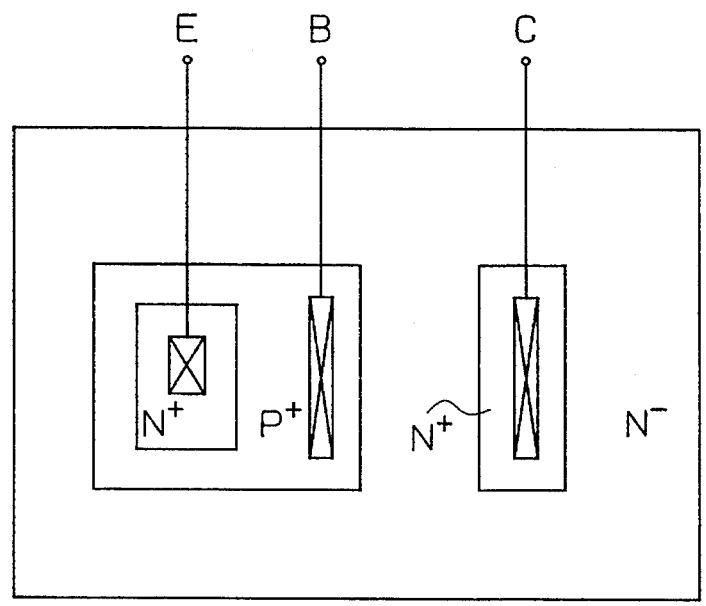
FIG. 5 is a plane view of the semiconductor device given by a PN junction isolation method and shown for comparison and indicates the element size.
Figure 6:
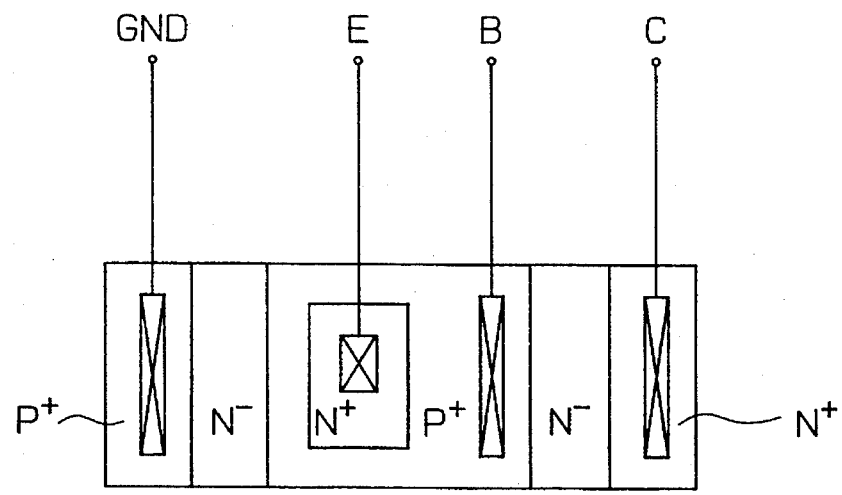
FIG. 6 is a plane view of the semiconductor device of the first embodiment and represents an element size against to the device of FIG. 5.

Namely, the size of the conventional transistor which provides PN junction isolation has become inevitably large due to the necessity for widely taking a low concentration collector as far as a P type isolation region, as shown in FIG. 5. Meanwhile, the structure of the embodiment may be made sufficiently small without impairing its functionality, as shown in FIG. 6 of the identical scale. This may serve for integration. In addition, in the embodiment it has been possible to reduce the size down to 1/2.61 as compared with that given by the conventional PN junction isolation method.

Figure 7:
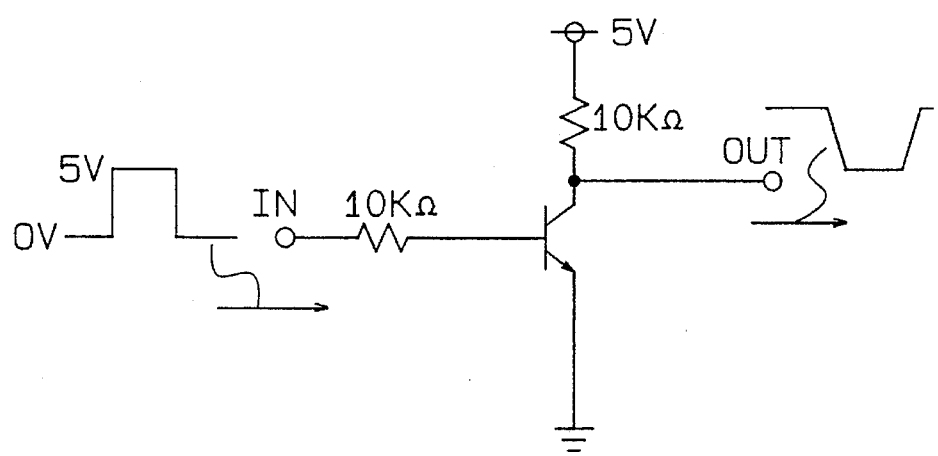
FIG. 7 is a circuit diagram for switching speed measurement.
Figure 8:
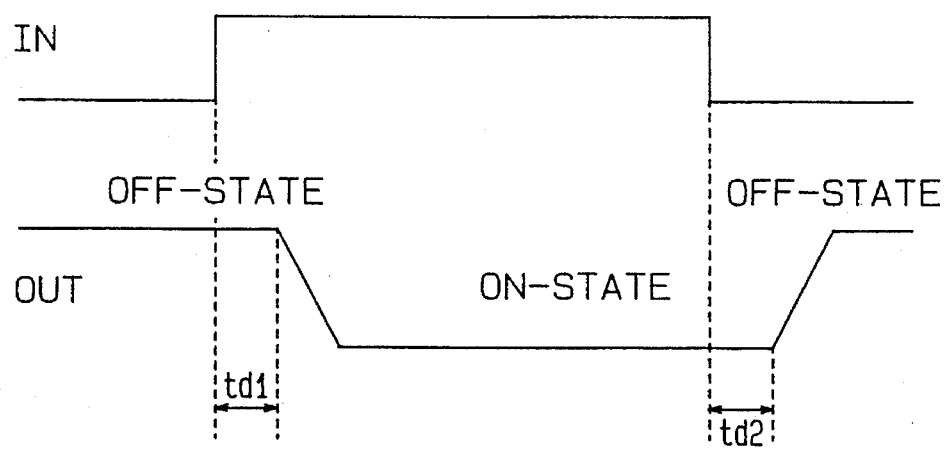
FIG. 8 shows a signal wave chart for switching speed measurement.

Next, switching characteristics of the first embodiment will be described. A switching time of the transistor may be measured by a circuit shown in FIG. 7, and the switching time may be estimated with delay times td1, td2 shown in FIG. 8.

Figure 9:
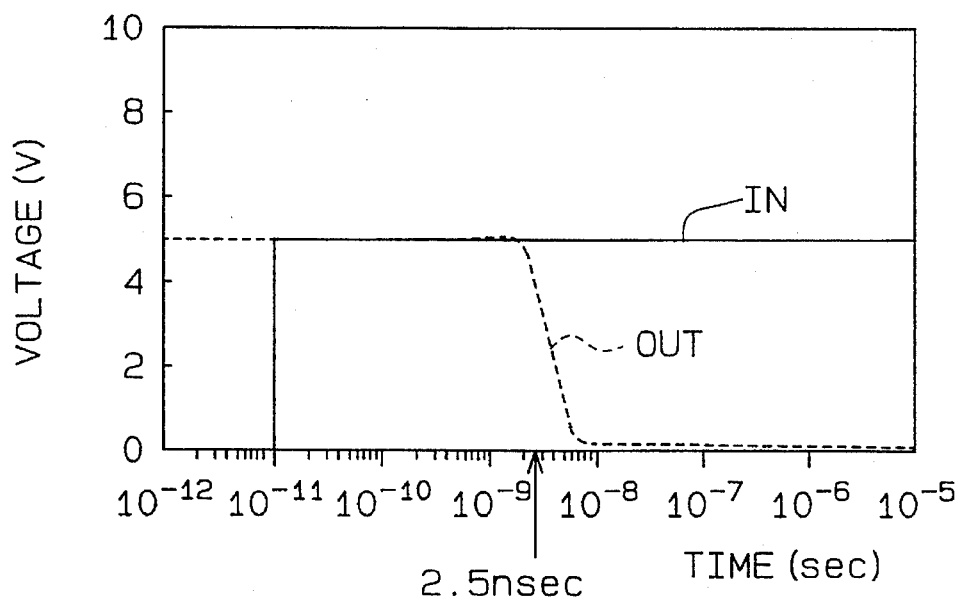
Figure 10:
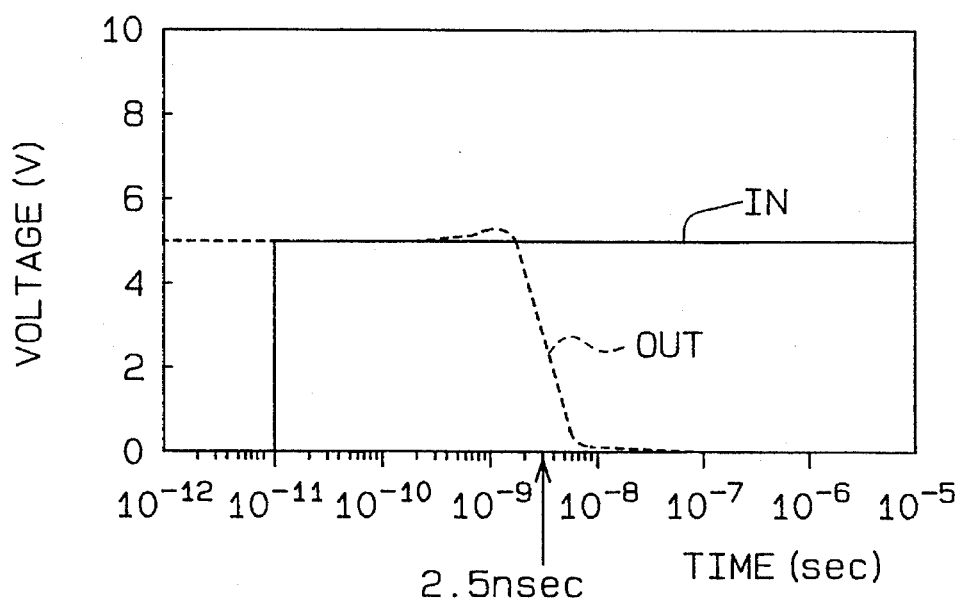

FIG. 9 illustrates an OFF to ON switching time of the conventional PN junction isolated type NPN transistor FIG. 10 also illustrates an OFF to ON switching time of the conventional dielectric isolated type NPN transistor. Furthermore, FIG. 11 indicates an OFF to ON switching time of the dielectric isolated type NPN transistor of the embodiment shown in FIG. 1.

Figure 11:
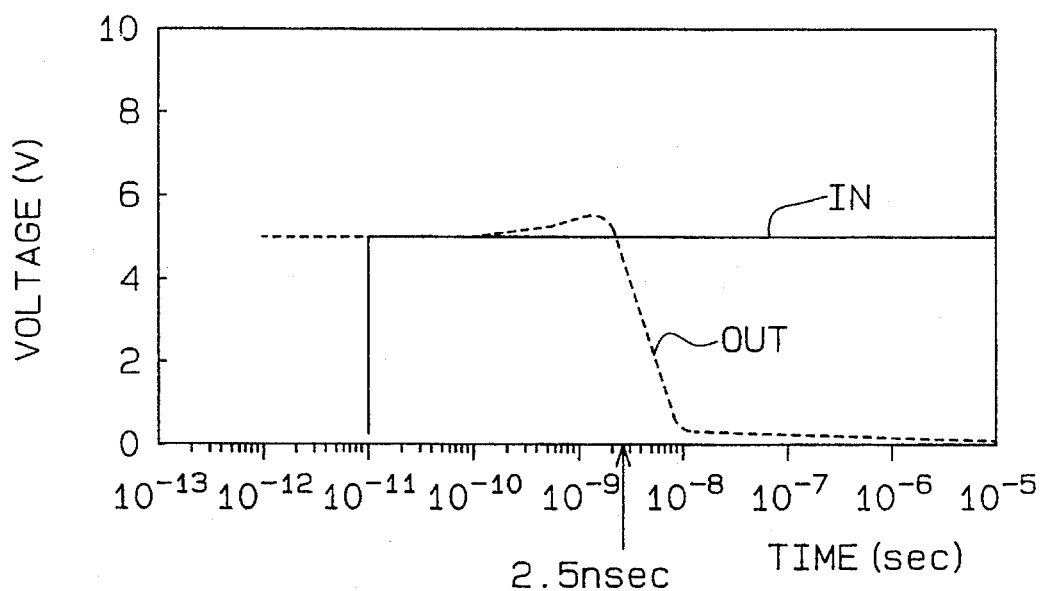

As shown clearly in FIG. 9 to FIG. 11, the OFF to ON switching time hardly involves any difference among the transistors of three structures and therefore is td1=2.5 nsec. This reason is considered. It is possible to regard the OFF to ON switching time td1 as the sum of two times. One is a time required for charging an emitter-base junction capacitance. The other is a time delay following a carrier transition time till the following effect appears in a collector current. The above-mentioned effect is due to the fact that carriers are injected into a base region through an emitter-base junction of a forward operating state to cause movement of the carriers from the emitter to the collector in the base region. Because these times depend mainly on the three dimensional configuration of the emitter and base, it is considered that there is no difference in td1 among the three structures, as shown FIGS. 9, 10 and 11.

Figure 12:
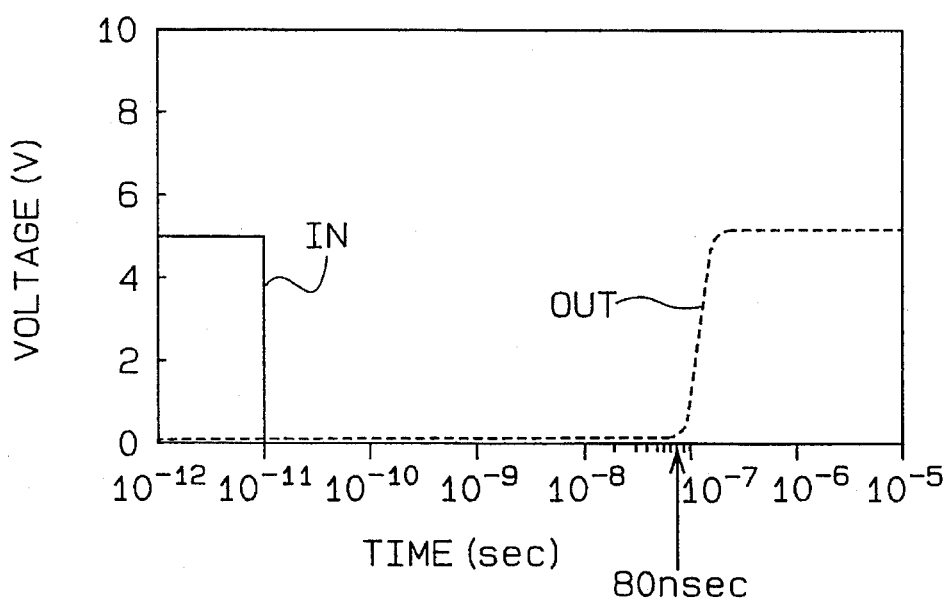
FIG. 12 is a characteristics chart indicating a measuring result of a switching speed when a NPN transistor with PN junction isolation is turned from ON to OFF.
Figure 13:
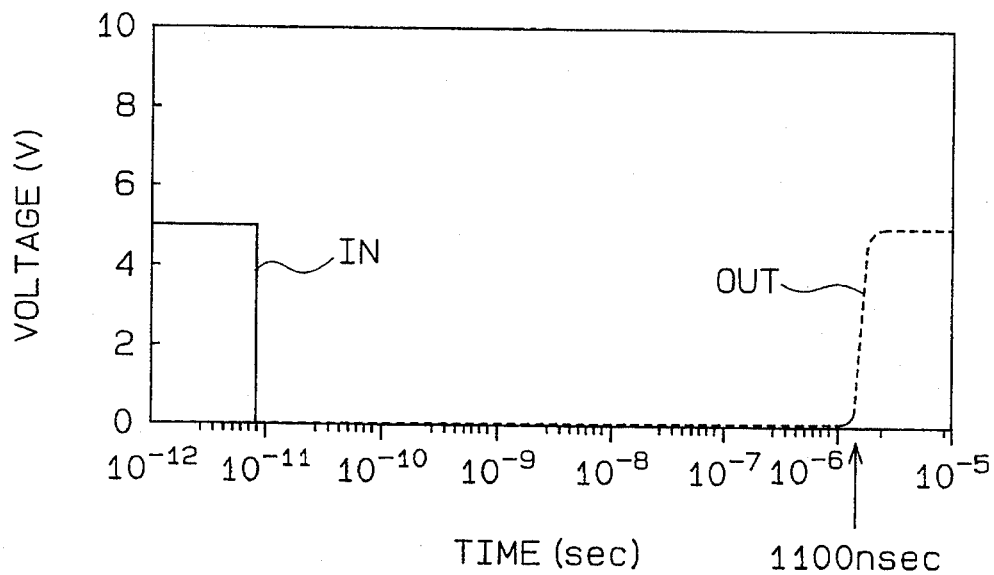
FIG. 13 is a characteristics chart indicating a measuring result of a switching speed when a conventional dielectric isolated type NPN transistor is turned from ON to OFF.
Figure 14:
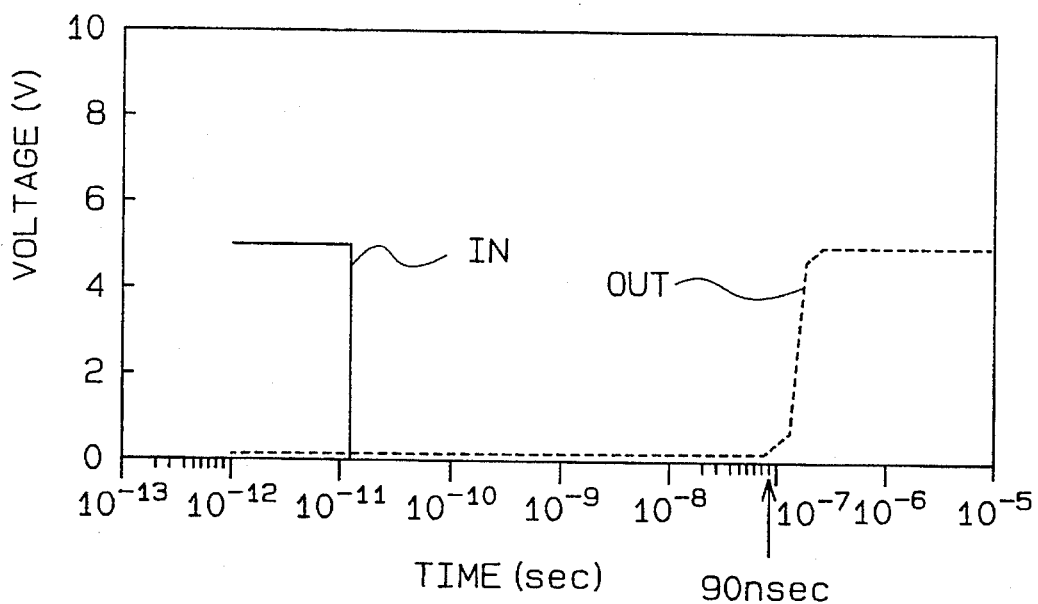
FIG. 14 is a characteristics chart indicating a switching speed when the semiconductor device shown in FIG. 1 is turned from ON to OFF.

Next, the switching time td2 when shifted from ON to OFF is evaluated. FIG. 12 shows an ON to OFF switching time of the conventional PN junction isolated type NPN transistor. FIG. 13 also shows measured result of an ON to OFF switching time of the conventional dielectric isolated type NPN transistor. Furthermore, FIG. 14 shows an ON to OFF switching time of the dielectric isolated type NPN transistor of the embodiment shown in FIG. 1.

When switching from ON to OFF in the conventional dielectric isolated NPN transistor, electric charges of the emitter-base junction capacity are discharged through the base electrode and the transistor enters a reverse operating state. Injected carriers of the base region and collector region disappear by recombination and are simultaneously discharged as an inverse current of the emitter-base junction. This returns to a cut-off range while it causes a current flowing into the collector to reduce. A time required for this appears in delay of switching and constitutes the switching time td2 of the conventional dielectric isolation method. As shown in FIG. 13, the delay time td2 at this time is 1,100 nsec.

In contrast with this, in the conventional PN junction isolated type transistor, a parasitic PNP transistor having a P type region of an isolation region as a collector is operating. When ON state of the NPN transistor, a P type base region of the NPN transistor structure is operating as an emitter of the parasitic transistor, and holes for recombining with electrons in the base region of the NPN transistor are always supplied. Thus, it is possible to extract excessive electrons swiftly by recombination and to shorten the switching time as td2=80 nsec, as shown in FIG. 12.

The safe matter as this may be said with regard to the embodiment shown in FIG. 1. Namely, a parasitic PNP transistor having a P+ excessive carrier extraction region 9 as a collector is operating. When the NPN transistor is in an ON state, a P type base region of the NPN transistor structure is operating as an emitter of the parasitic transistor, and holes for recombining with electrons in the base region of the NPN transistor are always supplied. Thus, it is possible to quickly remove excessive electrons by recombination and to shorten the switching time td2 to 90 nsec, as shown in FIG. 14.

Namely, in the dielectric isolated type transistor it is also possible to quicken the switching speed to td2=90 nsec by forming a parasitic transistor compositely in the isolated island, like the embodiment.

In this case, because of the necessity for forming the P+ excessive carrier extraction region 9, a plane size becomes large by about 10 μm to 15 μm, as compared with a conventional dielectric isolated type NPN transistor. However, the switching time may be largely shortened. The element size may be made remarkably small, as compared with a conventional PN junction isolated type NPN transistor element, as previously described.

As described above, in the embodiment, provided are the P⁻ silicon substrate 3 and the island 15 which is arranged on the P⁻ silicon substrate 3 interposing the silicon oxide film 4 (an insulation layer) therebetween and in which the N⁻ layer 16 (a low concentration silicon layer of the first conductivity type) is formed on the N⁺ layer 2 (a high concentration silicon layer of the first conductivity type). Provided also are the silicon oxide film 5 (an insulation film) formed on the outer periphery portion of the island 15, the P⁺ base region 8 (a base region of the second conductivity type) formed in the N⁻ layer 16 of the island 15, the N⁺ emitter region 10 (an emitter region of the first conductivity type) formed in the N⁺ layer 16 of the island 15, the N⁺ collector region 11 (a collector region of the first conductivity type) formed in the N⁺ layer 16 of the island 15, and the P⁺ excessive carrier extraction region 9 (a region of the second conductivity type for extracting excessive carriers) to which an constant electric potential is applied. Accordingly, when the bipolar transistor is turned from the ON state to the OFF state, excessive carriers are removed from the P⁺ excessive carrier extraction region 9 and the switching speed becomes quick. As a result, the bipolar transistor may be made small in size with the withstand voltage ensured, and the switching speed of the transistor may not be deteriorated.

Additionally, as an applied example of the embodiment, for instance, the device may be applied to a BiCMOS or a bipolar integrated circuit including I²L elements, or may be applied to a PNP transistor to prevent a deterioration of a switching speed by combining a parasitic NPN transistor with the PNP transistor.

The Second Embodiment

Next, the second embodiment will be explained with points of difference from the first embodiment mainly.

Figure 15:
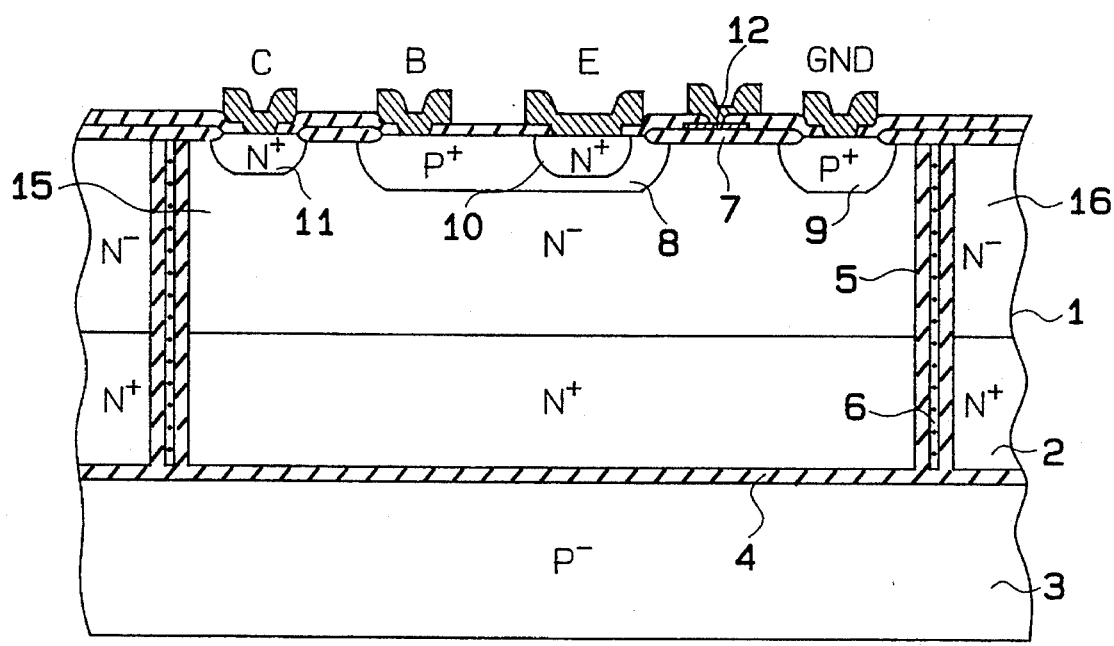
FIG. 15 is a sectional view of a semiconductor device of a second embodiment.
Figure 16:
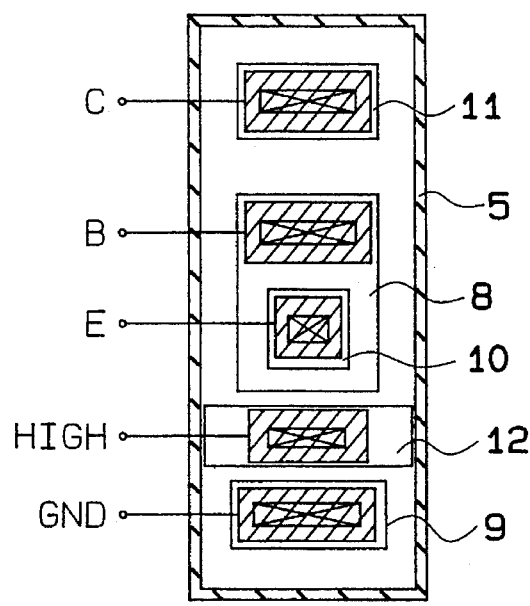
FIG. 16 is a plane view of the semiconductor device shown in FIG. 15.

A semiconductor device of the embodiment is shown in its sectional view by FIG. 15 and shown in its plane view by FIG. 16. In the embodiment, countermeasure is taken against deterioration of a withstand voltage given by a punch-through which is apt to occur because in case of using a substrate of which a main face is (100) plane a surface electric charge density Qss of the substrate is low.

In FIG. 15, a (100) substrate is used as an N⁻ silicon substrate 1 which becomes an SOI layer. As shown in FIG. 15 and FIG. 16, a polysilicon electrode 12 (an electrode for depletion layer restraint) is arranged on a field oxide film 7 existing at an upper portion of an N⁻ layer (a low concentration collector) 16 between a P⁺ base region 8 and a P⁺ excessive carrier extraction region 9 as punch-through restraint means between both P type regions. A constant electric potential greater than an electric potential of the N⁻ layer 16 is applied to the polysilicon electrode 12.

In a saturation range of the NPN transistor, a PN junction between the N⁻ layer 16 and the P⁺ excessive carrier extraction region 9 enters a reverse bias state. Thus, the depletion layer extends from the PN junction toward the N⁻ layer 16. Accordingly, a withstand voltage between the N⁻ layer 16 and the P⁺ excessive carrier extraction region 9 is going to lower. However, extension of the depletion layer is restrained by an electric potential applied to the polysilicon electrode 12 and thus a high withstand voltage may be maintained.

In addition, an electric potential applied to the polysilicon electrode 12 may be given by a short circuit with a base region or high level line except transistor wiring.

Figure 17:
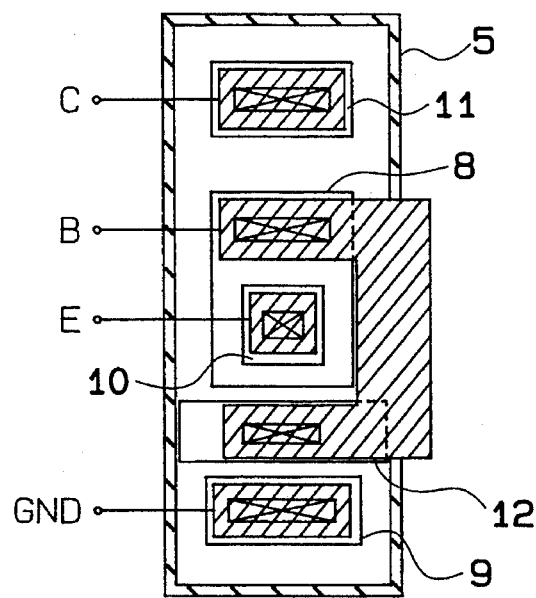
FIG. 17 to FIG. 21 are plane views of semiconductor devices as application examples of the second embodiment.
Figure 18:
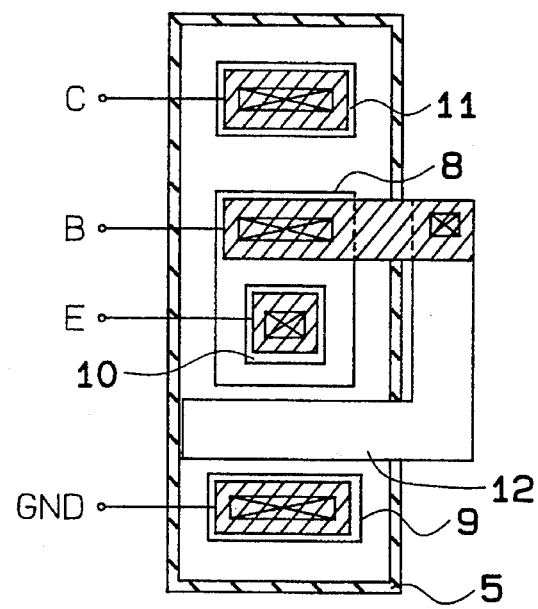
Figure 19:
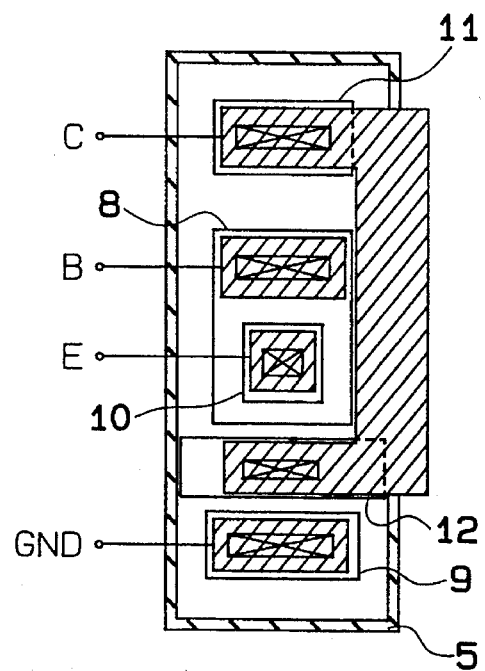
Figure 20:
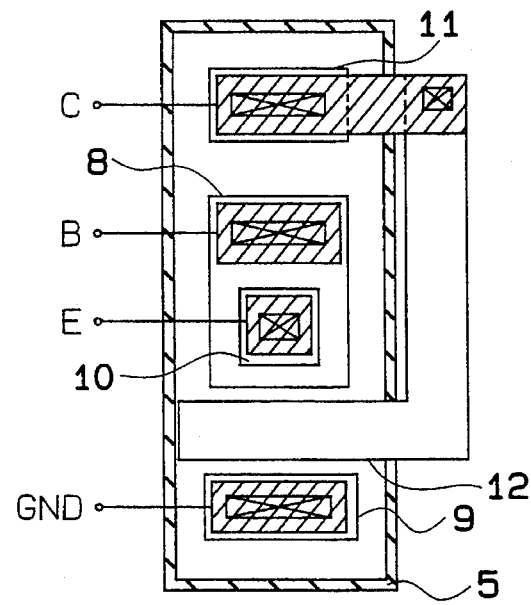
Figure 21:
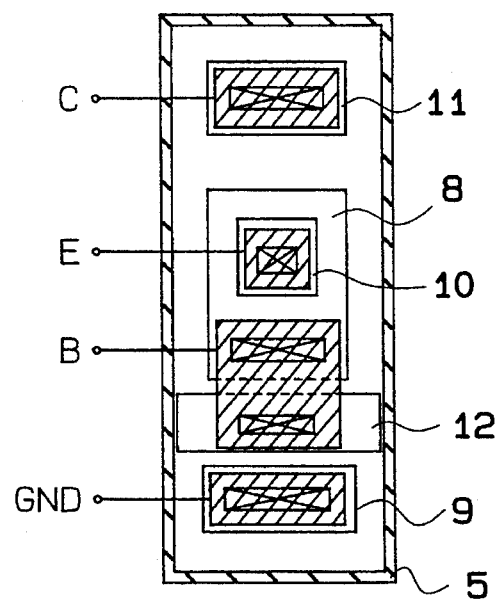

FIG. 17 to FIG. 21 show plane views of applied examples of the second embodiment. Namely, although in the above-mentioned second embodiment an electric potential is solely applied to the polysilicon electrode 12, the polysilicon electrode 12 may be connected to a base by using aluminum wiring material, as shown in FIG. 17. The polysilicon electrode 12 may be extended and connected to the base electrode, as shown in FIG. 18. As shown in FIG. 19, the polysilicon electrode 12 may be connected to a collector by using aluminum wiring material. As shown in FIG. 20, the polysilicon electrode 12 may be extended and connected to the collector electrode. Furthermore, as shown in FIG. 21, the polysilicon electrode 12 may be directly connected to the base region 8 using aluminum wiring material. In this case, an arranged location of the emitter region 10 may be formed in the base region 8 such that a base contact location is arranged in the vicinity of the polysilicon electrode 12.

The Third Embodiment

Next, the third embodiment will be explained in connection with main points of difference from the first embodiment.

Figure 22:
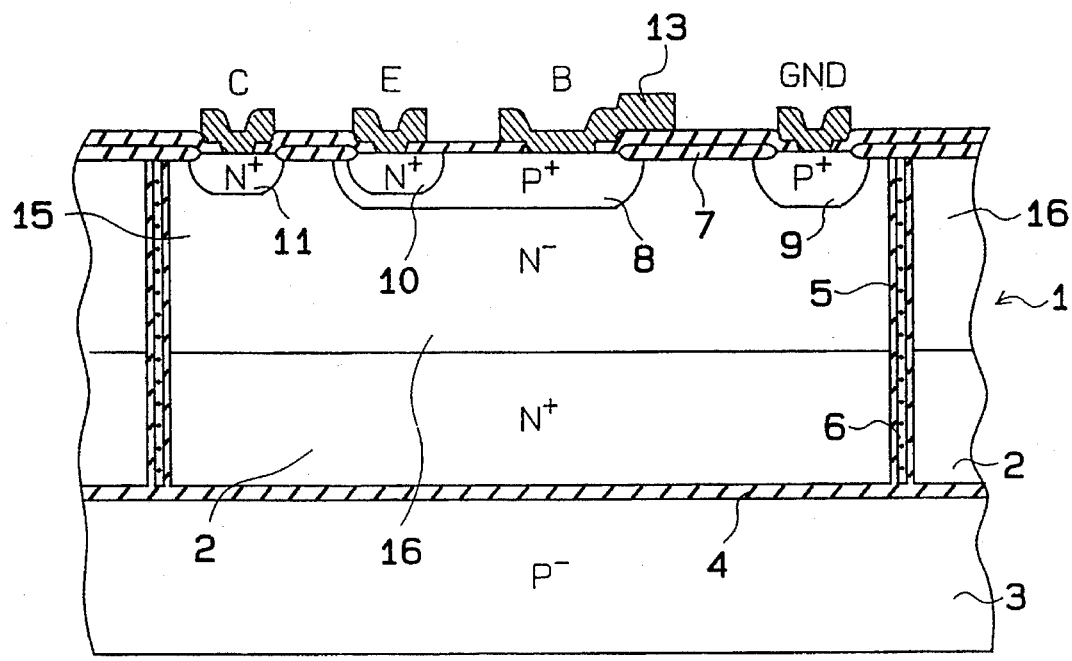
FIG. 22 is a sectional view of a semiconductor device of a third embodiment.

FIG. 22 shows a semiconductor device of the embodiment. In the embodiment, a countermeasure against a deterioration of a withstand voltage due to punch-through phenomena is also taken because, when a (100) substrate is used as a silicon substrate 1, its surface electric charge density Qss is low, like the above-mentioned second embodiment.

In FIG. 22, an aluminum electrode 13 of a base (the P+ base region 8) is extended to an upper portion of the N⁻ layer 16 toward the P⁺ excessive carrier extraction region.

As described above, a depletion layer extends to the N⁻ layer 16 from a PN junction between the P⁺ excessive carrier extraction region 9 and the N⁻ layer 16 in the saturation range of the transistor, and a withstand voltage between the P⁺ base region 8 and the P⁺ excessive carrier extraction region 9 is going to lower. However, a positive electric potential is applied to the N⁻ layer 16 to restrain an extension of the depletion layer, since the base electrode 13 is extended to the upper portion of the N⁻ silicon substrate 1 toward the P⁺ excessive carrier extraction region. Thus, a punch-through between the P⁺ base region 8 and the P⁺ excessive carrier extraction region 9 is restricted to maintain a high withstand voltage.

The Fourth Embodiment

Next, the fourth embodiment will be explained in connection with main points of difference from the first embodiment.

Figure 23:
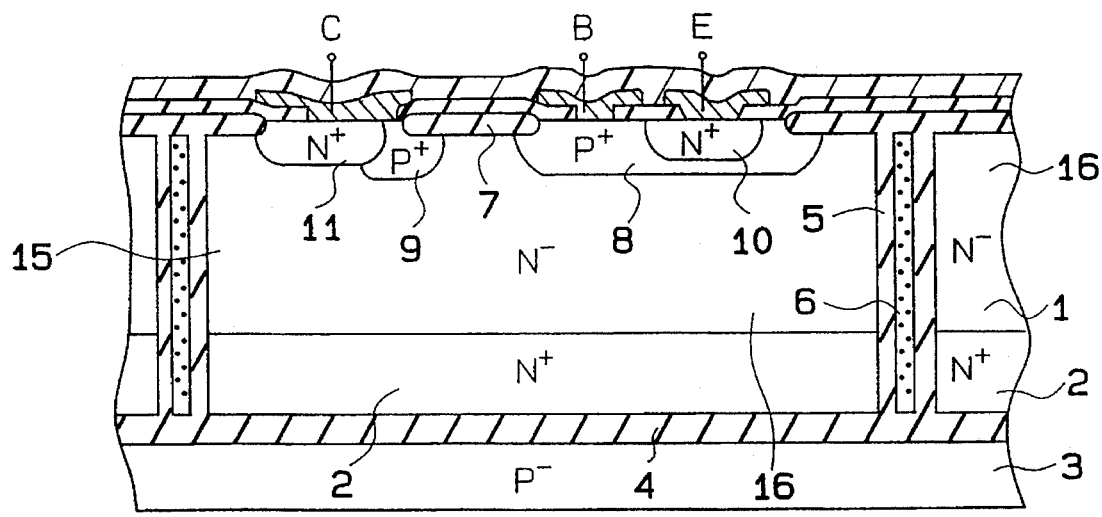
FIG. 23 is a sectional view of a semiconductor device of a fourth embodiment.

As shown in FIG. 23, the P⁺ excessive carrier extraction region 9 is disposed in a vicinity of an N⁺ collector region 11, and then the N⁺ collector region 11 and the P⁺ excessive carrier extraction region 9 are connected by an aluminum electrode (a collector electrode) to assume an identical electric potential.

With this structure, while an NPN transistor is operating in a saturation range, a PNP transistor formed between the P⁺ excessive carrier extraction region 9 and the P⁺ base region 8 operates and functions to extract holes in the P⁺ base region 8 and the N⁺ collector region 11. Thus, a switching speed to an OFF state from a state in which the NPN transistor is operating (ON) in the saturation range is shortened. Furthermore, in a state in which the NPN transistor is operating in an active range, the parasitic PNP transistor does not operate, resulting in no influences on the transistor characteristics.

Furthermore, with this structure, magnification of the transistor size given by arranging the P⁺ excessive carrier extraction region 9 becomes large only by about 5 μm to 10 μm, as compared with a conventional dielectric isolated type element.

The Fifth Embodiment

Next, the fifth embodiment will be explained in connection with main points of difference from the second embodiment.

Figure 24:
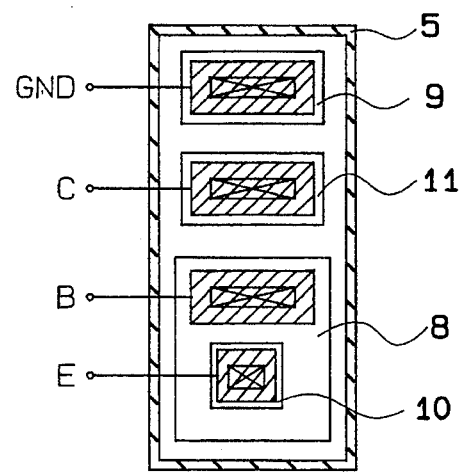
FIG. 24 is a plane view of a semiconductor device of a fifth embodiment.
Figure 25:
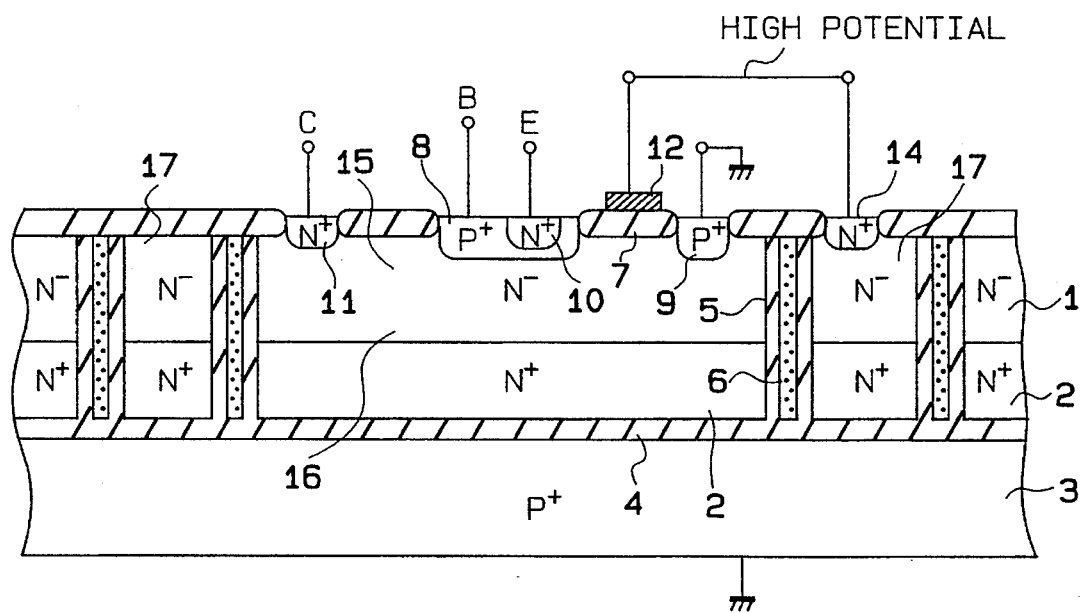
FIG. 25 is a sectional view of a semiconductor device of a sixth embodiment.

In the second embodiment shown in FIG. 16, the polysilicon electrode 12 has been provided on the field oxide film 7 for ensuring a withstand voltage between the P⁺ base region 8 and the P⁺ excessive carrier extraction region 9. In contrast with this, in the embodiment an N⁺ collector region 11 is disposed between the P⁺ excessive carrier extraction region 9 and the P⁺ base region 8 as a punch-through stopper, as shown in FIG. 24. Thus, the N⁺ collector region 11 corresponding to a contact portion of a collector becomes present between the P⁺ excessive carrier extraction region 9 and the P⁺ base region 8. Accordingly, it is possible to automatically perform channel cut and also to make the transistor size smaller.

The Sixth Embodiment

Next, the sixth embodiment will be explained in connection with main points of diff fence from the second embodiment.

In the embodiment, in addition to the island 15 having an NPN transistor, for instance an island 17 is also formed to surround the NPN transistor, and an N⁺ region 14 is formed in a surface of the island 17. A high level electric potential is applied to the N⁺ region 14, the island 17 is utilized as high level line and the polysilicon electrode 12 and the island 17 are electrically connected by another N⁺ region 14. This makes unnecessary special wiring for maintain the polysilicon electrode 12 in the high level electric potential, being capable of making a chip size small.

The Seventh Embodiment

Next, the seventh embodiment will be explained in connection with main points of difference from the second embodiment.

Figure 26:
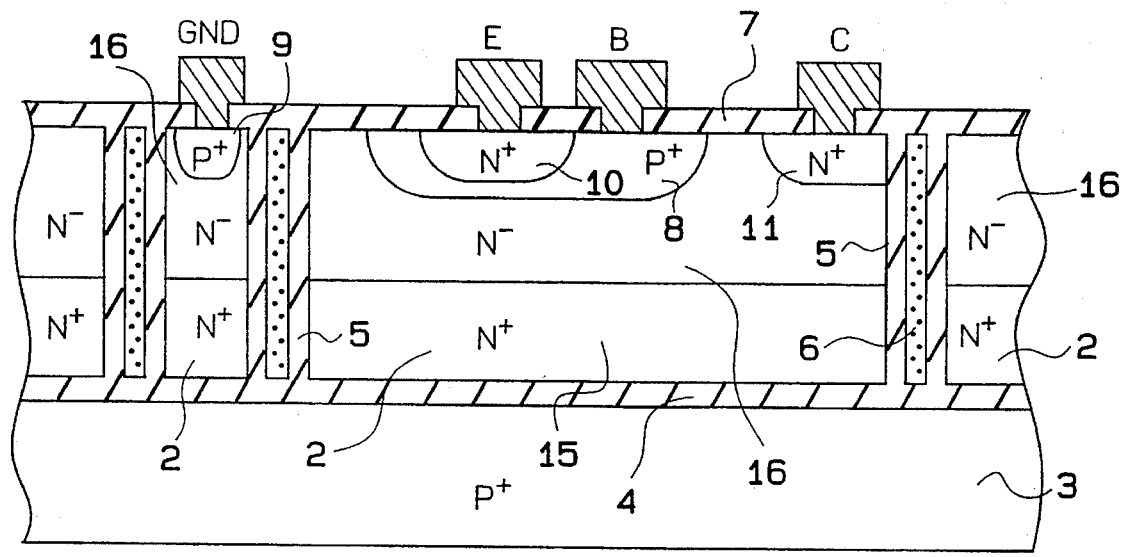
FIG. 26 is a sectional view of a semiconductor device of a seventh embodiment.
Figure 27:
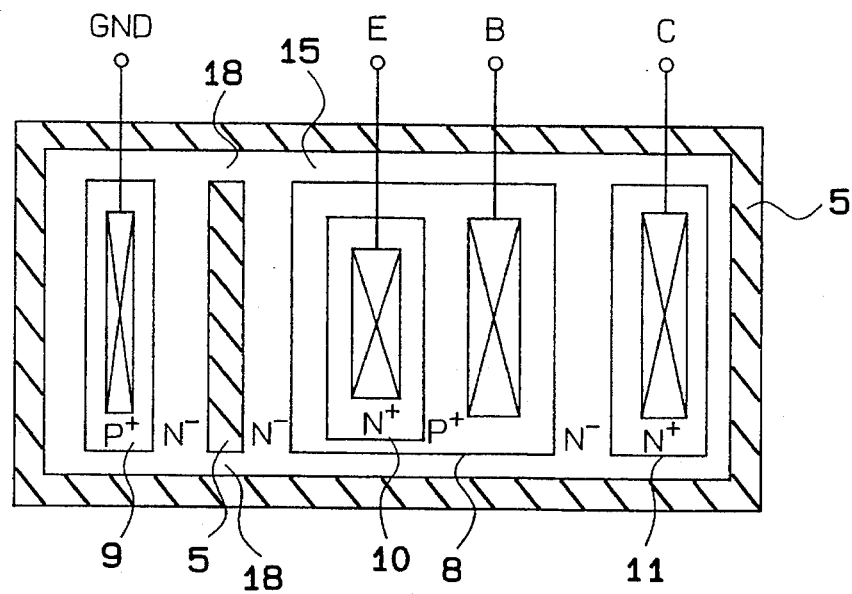
FIG. 27 is a plane view of the semiconductor device shown in FIG. 26.
Figure 28:
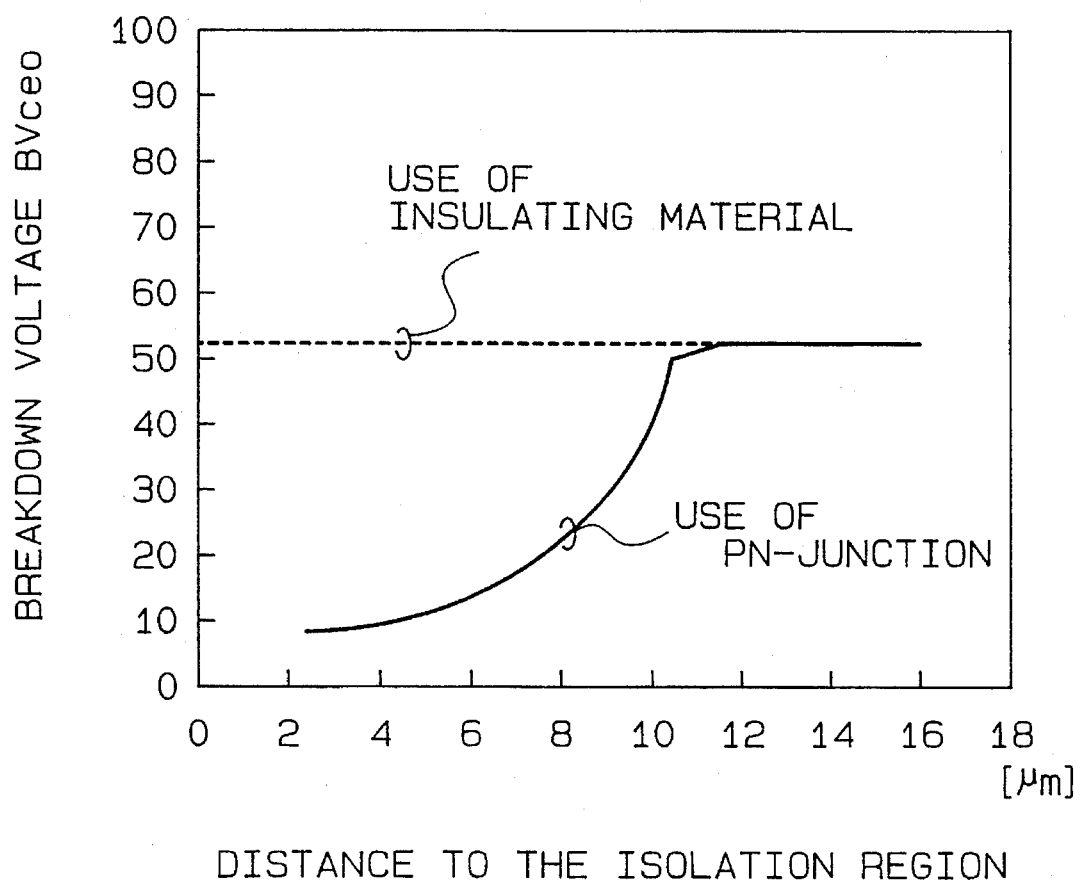
FIG. 28 is a characteristic diagram indicating a relationship between a distance to an isolation region and a withstand voltage.

In the second embodiment shown in FIGS. 15 and 16, the polysilicon electrode 12 is arranged on the field oxide film 7 for ensuring a withstand voltage between the P⁺ base region 8 and the P⁺ excessive carrier extraction region 9. In contrast with this, in this embodiment a trench which is buried with an insulation film 5 such as a silicon oxide film or the like is formed between the NPN transistor and the P⁺ excessive carrier extraction region 9, as shown in FIGS. 26 and 27. This trench may be formed simultaneously with an isolation trench between elements, i.e., islands 15, and the insulation film 5 may be also formed when a side wall of the isolation trench is oxidized. In case an internal space in the trench is present, filling with polycrystalline silicon 6 is performed without increase of process steps. As shown in FIGS. 26 and 27, the trench is formed only in a region where the P⁺ base region 8 and the P⁺ excessive carrier extraction region 9 are opposed. Namely, within the island 15, a communication passage 18 provided by the N⁻ layer 16 and the N⁺ layer 2 remains between a region in which the NPN transistor is constructed and a region in which the P⁺ excessive carrier extraction region 9 is formed. In addition, this communication passage 18 may be provided between the trench partitioning both the regions and the outer isolation trench for isolating the island 15 to be present on at least one end portion of the trench.

With such a construction as described above, a punch-through between the P⁺ base region 8 and the P⁺ excessive carrier extraction region 9 may be restrained to restrain lowering of the withstand voltage.

As described above in detail, according to the present invention, it is possible to exhibit excellent effects that the high withstand bipolar transistor is made compact and deterioration in the switching speed of the transistor is prevented.

What is claimed is:

1. A main bipolar transistor comprising:

a silicon substrate;

an island disposed on said silicon substrate with an insulation film disposed therebetween, said island having a high concentration silicon layer of a first conductivity type and a low concentration silicon layer of the first conductivity type which is disposed on the high concentration silicon layer;

an insulation film formed on an outer peripheral portion of said island;

a base region of a second conductivity type formed in a surface of said low concentration silicon layer of said island as a base region of said bipolar transistor;

an emitter region of the first conductivity type formed within said base region as an emitter region of said bipolar transistor;

a collector region of the first conductivity type formed in the surface of said low concentration silicon layer of said island as a collector region of said bipolar transistor;

a diffusion region of the second conductivity type for extracting excessive carriers-formed at the surface of said low concentration silicon layer of said island, a constant electric potential being applied to said diffusion region;

an emitter electrode formed on said emitter region as an emitter electrode of said bipolar transistor;

a base electrode formed on said base region as a base electrode of said bipolar transistor;

a collector electrode formed on said collector region as a collector electrode of said bipolar transistor; and an extracting electrode formed on said diffusion region;

wherein said emitter region, said base region and said collector region collectively form said bipolar transistor;

said base region, said collector region and said diffusion region collectively form a parasitic transistor removing excessive charge carriers from said low concentration silicon layer of the first conductivity type to said extracting electrode when said bipolar transistor is in a saturation mode;

said diffusion region is a collector of said parasitic transistor; and said diffusion region has a reference potential applied thereto so that when said bipolar transistor is on, said parasitic transistor is also on.

2. A semiconductor device as claimed in claim 1, further comprising an electrode for depletion layer restraint disposed through an insulation film on a surface location of said low concentration silicon layer of the first conductivity type between said base region and said diffusion region for extracting excessive carriers, an electric potential which is at least an electric potential at said surface location being applied to said electrode for depletion layer restraint.

3. A semiconductor device as claimed in claim 1, wherein said collector region is disposed between said base region and said diffusion region for extracting excessive carriers.

4. The transistor of claim 1, wherein said reference potential is a ground potential.

5. The transistor of claim 1, wherein an emitter of said parasitic transistor is said base of said bipolar transistor.

6. The transistor of claim 1, wherein a base of said parasitic transistor is a collector of said main transistor.

7. The transistor of claim 1, wherein when said main transistor is on, current flows from said collector of said main transistor to said base of said main transistor.

8. A dielectric isolated type main bipolar transistor comprising:

a semiconductor island of a first conductivity type, said semiconductor island isolated by insulation material from a substrate and other element regions;

a base region of a second conductivity type formed in a surface of said semiconductor island as a base region of said bipolar transistor;

a collector region of the first conductivity type formed in said semiconductor island as a collector region of said bipolar transistor;

an emitter region of the first conductivity type formed in said base region as an emitter region of said bipolar transistor;

an excessive carrier extraction region of the second conductivity type formed in said collector region, a constant electric potential being applied to said excessive carrier extraction region;

a base electrode formed so as to contact only said base region in said semiconductor island as a base electrode of said bipolar transistor;

a collector electrode formed so as to contact only said collector region in said semiconductor island as a collector electrode of said bipolar transistor; and an emitter electrode formed so as to contact only said emitter region in said semiconductor island as an emitter electrode of said bipolar transistor;

wherein said emitter region, said base region and said collector region collectively form said bipolar transistor;

said base region, said collector region and said excessive carrier extraction region collectively form a parasitic transistor removing excessive charge carriers from said semiconductor island of a first conductivity type to said excessive carrier region when said bipolar transistor is in a saturation mode;

said diffusion region is a collector of said parasitic transistor; and said diffusion region has a reference potential applied thereto so that when said bipolar transistor is on, said parasitic transistor is also on.

9. A dielectric isolated type semiconductor device as claimed in claim 8, wherein the constant electric potential applied to said excessive carrier extraction region is a grounding electric potential.

10. A dielectric isolated type semiconductor device as claimed in claim 8, wherein punch-through restraint means for restraining a punch-through between said excessive carrier extraction region and said base region is provided between said excessive carrier extraction region and said base region.

11. A dielectric isolated type semiconductor device as claimed in claim 10, wherein said punch-through restraint means is a plate electrode which is disposed between said excessive carrier extraction region and said base region and to which a predetermined electric potential is applied.

12. A dielectric isolated type semiconductor device as claimed in claim 11, wherein the predetermined electric potential is a base electric potential.

13. A dielectric isolated type semiconductor device as claimed in claim 11, wherein the predetermined electric potential is a collector electric potential.

14. A dielectric isolated type semiconductor device as claimed in claim 10, wherein said punch-through restraint means is a collector contact region which is disposed between said excessive carrier extraction region and said base region.

15. A dielectric isolated type semiconductor device as claimed in claim 10, wherein said punch-through restraint means is a trench which is disposed between said excessive carrier extraction region and said base region.

16. The transistor of claim 8, wherein said reference potential is a ground potential.

17. The transistor of claim 8, wherein an emitter of said parasitic transistor is said base of said bipolar transistor.

18. The transistor of claim 8, wherein a base of said parasitic transistor is a collector of said main transistor.

19. The transistor of claim 8, wherein when said main transistor is on, current flows from said collector of said main transistor to said base of said main transistor.

20. A bipolar transistor comprising:

a silicon substrate;

an island disposed on said silicon substrate with an insulation film disposed therebetween, said island having a high concentration silicon layer of a first conductivity type and a low concentration silicon layer of the first conductivity type which is disposed on the high concentration silicon layer;

an insulation film formed on an outer peripheral portion of said island;

a base region of a second conductivity type formed in a surface of said low concentration silicon layer of said island as a base region of said bipolar transistor;

an emitter region of the first conductivity type formed within said base region as an emitter region of said bipolar transistor;

a collector region of the first conductivity type formed in the surface of said low concentration silicon layer of said island as a collector region of said bipolar transistor;

a diffusion region of the second conductivity type for extracting excessive carriers formed at the surface of said low concentration silicon layer of said island, a constant electric potential being applied to said diffusion region;

an emitter electrode formed on said emitter region as an emitter electrode of said bipolar transistor;

a base electrode formed on said base region as a base electrode of said bipolar transistor;

a collector electrode formed on said collector region as a collector electrode of said bipolar transistor; and an extracting electrode formed on said diffusion region;

wherein said emitter region, said base region and said collector region collectively form said bipolar transistor;

said base region, said collector region and said diffusion region collectively form a parasitic transistor, removing excessive charge carriers from said low concentration silicon layer of the first conductivity type to said extracting electrode when said bipolar transistor is in a saturation mode;

said bipolar transistor and said parasitic transistor are connected so that when said bipolar transistor is saturated, said parasitic transistor is on; and said diffusion region has a reference potential applied thereto so that when said bipolar transistor is in active mode, said parasitic transistor is off.

21. The transistor of claim 20, wherein said diffusion region and said collector of said bipolar transistor are equipotential.

* * * * *